United States Patent [19]

Takeshima et al.

[11] Patent Number: 5,757,699
[45] Date of Patent: May 26, 1998

[54] PROGRAMMING WHICH CAN MAKE THRESHOLD VOLTAGES OF PROGRAMMED MEMORY CELLS HAVE A NARROW DISTRIBUTION IN A NONVOLATILE SEMICONDUCTOR MEMORY

[75] Inventors: Toshio Takeshima; Hiroshi Sugawara, both of Tokyo, Japan

[73] Assignee: NEC Corporation, Tokyo, Japan

[21] Appl. No.: 862,965

[22] Filed: Jun. 3, 1997

[30] Foreign Application Priority Data

Jun. 3, 1996 [JP] Japan ................... 8-140497

[51] Int. Cl.[6] ........................... G11C 7/00
[52] U.S. Cl. ................... 365/185.24; 365/185.22; 365/185.19; 365/185.03
[58] Field of Search ............. 365/185.24, 185.21, 365/185.19, 185.03

[56] References Cited

U.S. PATENT DOCUMENTS

| 5,608,679 | 3/1997 | Mi et al. | 365/185.19 |
| 5,668,759 | 9/1997 | Ohtsuki | 365/185.22 |

FOREIGN PATENT DOCUMENTS

| 5-182474 | 7/1993 | Japan . |
| 6-282992 | 10/1994 | Japan . |
| 7-312093 | 11/1995 | Japan . |

OTHER PUBLICATIONS

T. Takeshima et al., "A 3.3 V. Single–Power–Supply 64Mb Flash Memory with Dynamic Bit–Line Latch (DBL) Porgramming Scheme", *1994 IEEE International Solid–State Circuits Conference*, pp. 148 and 149 no month.

M. Ohkawa et al., "A 98mm$^2$ 3.3V 64Mb Flash memory with FN–NOR Type 4–level Cell", *1996 IEEE International Solid–State Circuits Conference*, pp. 36 and 37 no month.

*Primary Examiner*—Vu A. Le
*Attorney, Agent, or Firm*—Young & Thompson

[57] ABSTRACT

On programming a selected memory cell of a nonvolatile semiconductor memory, first programming (S11) of the selected memory cell is made by applying a first programming pulse to the selected memory cell to make the selected memory cell have a programmed threshold voltage (Vtm). First verification (S12) is made whether the selected memory cell has the programmed threshold voltage which is not greater than a first predetermined upper limit voltage (Vt1). When the selected memory cell has the programmed threshold voltage greater than the Vt1, the first programming is again made. When the selected memory cell has the programmed threshold voltage not greater than the Vt1, second verification (S13) is made whether the selected memory cell has the programmed threshold voltage which is not greater than a second predetermined upper limit voltage (Vt10) less than the Vt1. When the selected memory cell has the programmed threshold voltage greater than the Vt10, second programming (S13) of the selected memory cell by applying a second programming pulse different from the first programming pulse to the selected memory cell so as to make the selected memory cell have the programmed threshold voltage which is not greater than the Vt10. When the selected memory cell has the programmed threshold voltage not greater than the Vt10, programming of the selected memory cell is completed.

8 Claims, 10 Drawing Sheets

PROGRAMMING WHICH CAN MAKE THRESHOLD VOLTAGES OF PROGRAMMED MEMORY CELLS HAVE A NARROW DISTRIBUTION IN A NONVOLATILE SEMICONDUCTOR MEMORY

BACKGROUND OF THE INVENTION

This invention relates to a method of programming a selected memory cell of electrically erasable and programmable nonvolatile memory cells of a nonvolatile semiconductor memory which is typically used as a flash memory.

Programming is carried out for a selected memory cell selected from electrically erasable and programmable nonvolatile memory cells of a nonvolatile semiconductor memory. The programming is carried out only when an input datum has a particular logic level which is other than a logic "0" level. In other words, the programming is not carried out when the input datum has the logic "0" level.

The programming is carried out by applying a programming pulse to the selected memory cell to make the selected memory cell have a programmed threshold voltage as a cell threshold voltage. In this event, the cell threshold voltage of the selected memory cell is reduced by applying the programming pulse to the selected memory cell in a particular manner so that the selected memory cell has a reduced programmed threshold voltage which is not greater than a predetermined upper limit voltage. Alternatively, the cell threshold voltage of the selected memory cell is increased by applying the programming pulse to the selected memory cell in a different manner so that the selected memory cell has an increased programmed threshold voltage which is not less than a predetermined lower limit voltage.

As will later be described, any conventional programming technique can not make the programmed cell threshold voltages of the selected memory cells (namely, programmed memory cells) have a narrow distribution.

SUMMARY OF THE INVENTION

It is therefore an object of this invention to provide a programming method which can make threshold voltages of programmed memory cells have a narrow distribution in a nonvolatile semiconductor memory.

Other objects of this invention will become clear as the description proceeds.

A method to which this invention is applicable is for programming a selected memory cell of electrically erasable and programmable nonvolatile memory cells of a nonvolatile semiconductor memory in response to an input datum of a particular logic level.

According to a first aspect of this invention, the method comprises: a first programming step of programming the selected memory cell in response to the input datum by applying a first programming pulse to the selected memory cell to make the selected memory cell have a programmed threshold voltage; a first verifying step of verifying whether the selected memory cell has the programmed threshold voltage which is not greater than a first predetermined upper limit voltage; a re-executing step of re-executing the first programming step when the first verifying step verifies that the selected memory cell has the programmed threshold voltage which is greater than the first predetermined upper limit voltage, the re-executing step being carried out until the first verifying step verifies that the selected memory cell has the programmed threshold voltage which is not greater than the first predetermined upper limit voltage; a second verifying step of verifying, when the first verifying step verifies that the selected memory cell has the programmed threshold voltage which is not greater than the first predetermined upper limit voltage, whether the selected memory cell has the programmed threshold voltage which is not greater than a second predetermined upper limit voltage less than the first predetermined upper limit voltage; a second programming step of programming, when the second verifying step verifies that the selected memory cell has the programmed threshold voltage which is greater than the second predetermined upper limit voltage, the selected memory cell by applying a second programming pulse different from the first programming pulse to the selected memory cell so as to make the selected memory cell have the programmed threshold voltage which is not greater than the second predetermined upper limit voltage; and a completion step of completing programming of the selected memory cell when the second verifying step verifies that the selected memory cell has the programmed threshold voltage which is not greater than the second predetermined upper limit voltage.

According to a second aspect of this invention, the method comprises: a first programming step of programming the selected memory cell in response to the input datum by applying a first programming pulse to the selected memory cell to make the selected memory cell have a programmed threshold voltage; a first verifying step of verifying whether the selected memory cell has the programmed threshold voltage which is not greater than a first predetermined upper limit voltage; a re-executing step of re-executing the first programming step when the first verifying step verifies that the selected memory cell has the programmed threshold voltage which is greater than the first predetermined upper limit voltage, the re-executing step being carried out until the first verifying step verifies that the selected memory cell has the programmed threshold voltage which is not greater than the first predetermined upper limit voltage; a second verifying step of verifying, when the first verifying step verifies that the selected memory cell has the programmed threshold voltage which is not greater than the first predetermined upper limit voltage, whether the selected memory cell has the programmed threshold voltage which is not greater than a second predetermined upper limit voltage less than the first predetermined upper limit voltage; a second programming step of programming, when the second verifying step verifies that the selected memory cell has the programmed threshold voltage which is greater than the second predetermined upper limit voltage, the selected memory cell by applying a second programming pulse different from the first programming pulse to the selected memory cell so as to make the selected memory cell have the programmed threshold voltage which is not greater than the second predetermined upper limit voltage; a third verifying step of verifying, when the second verifying step verifies that the selected memory cell has the programmed threshold voltage which is not greater than the second predetermined upper limit voltage, whether the selected memory cell has the programmed threshold voltage which is not less than a predetermined lower limit voltage less than the second predetermined upper limit voltage; and a completion step of completing programming of the selected memory cell with the selected memory cell identified as a normally programmed cell when the third verifying step verifies that the selected memory cell has the programmed threshold voltage which is not less than the predetermined lower limit voltage. The completion step completes the programming of the selected memory cell with the selected memory cell identified as an abnormally programmed cell when the third verifying step verifies that the selected memory cell has the programmed threshold voltage which is less than the predetermined lower limit voltage.

According to a third aspect of this invention, the method comprises: a first programming step of programming the selected memory cell in response to the input datum by applying a first programming pulse to the selected memory cell to make the selected memory cell have a programmed threshold voltage; a first verifying step of verifying whether the selected memory cell has the programmed threshold voltage which is not less than a first predetermined lower limit voltage; a re-executing step of re-executing the first programming step when the first verifying step verifies that the selected memory cell has the programmed threshold voltage which is less than the first predetermined lower limit voltage, the re-executing step being carried out until the first verifying step verifies that the selected memory cell has the programmed threshold voltage which is not less than the first predetermined lower limit voltage; a second verifying step of verifying, when the first verifying step verifies that the selected memory cell has the programmed threshold voltage which is not less than the first predetermined lower limit voltage, whether the selected memory cell has the programmed threshold voltage which is not less than a second predetermined lower limit voltage greater than the first predetermined lower limit voltage; a second programming step of programming, when the second verifying step verifies that the selected memory cell has the programmed threshold voltage which is less than the second predetermined lower limit voltage, the selected memory cell by applying a second programming pulse different from the first programming pulse to the selected memory cell so as to make the selected memory cell have the programmed threshold voltage which is not less than the second predetermined lower limit voltage; and a completion step of completing programming of the selected memory cell when the second verifying step verifies that the selected memory cell has the programmed threshold voltage which is not less than the second predetermined lower limit voltage.

According to a fourth aspect of this invention, the method comprises: a first programming step of programming the selected memory cell in response to the input datum by applying a first programming pulse to the selected memory cell to make the selected memory cell have a programmed threshold voltage; a first verifying step of verifying whether the selected memory cell has the programmed threshold voltage which is not less than a first predetermined lower limit voltage; a re-executing step of re-executing the first programming step when the first verifying step verifies that the selected memory cell has the programmed threshold voltage which is less than the first predetermined lower limit voltage, the re-executing step being carried out until the first verifying step verifies that the selected memory cell has the programmed threshold voltage which is not less than the first predetermined lower limit voltage; a second verifying step of verifying, when the first verifying step verifies that the selected memory cell has the programmed threshold voltage which is not less than the first predetermined lower limit voltage, whether the selected memory cell has the programmed threshold voltage which is not less than a second predetermined lower limit voltage greater than the first predetermined lower limit voltage; a second programming step of programming, when the second verifying step verifies that the selected memory cell has the programmed threshold voltage which is less than the second predetermined lower limit voltage, the selected memory cell by applying a second programming pulse different from the first programming pulse to the selected memory cell so as to make the selected memory cell have the programmed threshold voltage which is not less than the second predetermined lower limit voltage; a third verifying step of verifying, when the second verifying step verifies that the selected memory cell has the programmed threshold voltage which is not less than the second predetermined lower limit voltage, whether the selected memory cell has the programmed threshold voltage which is not greater than a predetermined upper limit voltage greater than the second predetermined lower limit voltage; and a completion step of completing programming of the selected memory cell with the selected memory cell identified as a normally programmed cell when the third verifying step verifies that the selected memory cell has the programmed threshold voltage which is not greater than the predetermined upper limit voltage. The completion step completes the programming of the selected memory cell with the selected memory cell identified as an abnormally programmed cell when the third verifying step verifies that the selected memory cell has the programmed threshold voltage which is greater than the predetermined upper limit voltage.

DESCRIPTION OF THE PREFERRED EMBODIMENTS

Figure 1:
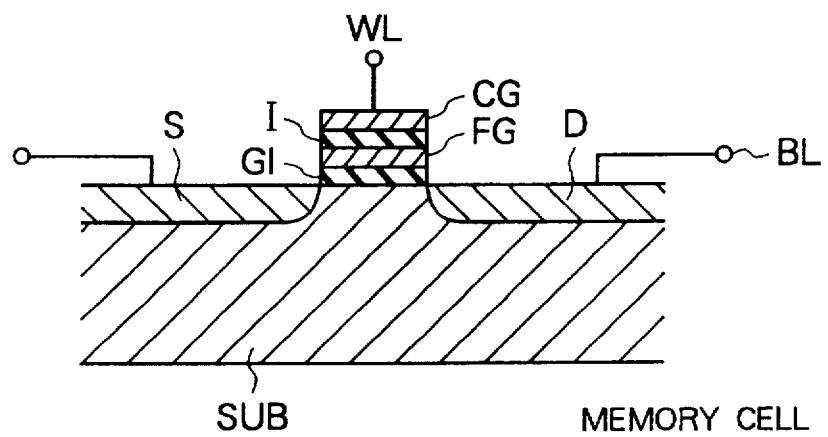
FIG. 1 is a sectional view of an electrically erasable and programmable nonvolatile memory cell of a nonvolatile semiconductor memory to which this invention is applicable.

Referring to FIG. 1, illustration is made of an electrically erasable and programmable nonvolatile memory cell of a nonvolatile semiconductor memory to which this invention is applicable. The nonvolatile semiconductor memory includes a memory cell array (later illustrated) in which a plurality of the illustrated electrically erasable and programmable nonvolatile memory cells are arranged in a matrix fashion.

In FIG. 1, each of the electrically erasable and programmable nonvolatile memory cells has a source S and a drain D which are formed on a principal surface of a semiconductor substrate SUB. A gate insulating film GI is formed on the principal surface of the semiconductor substrate SUB and between the source S and the drain D. A floating gate FG is formed on the gate insulating film GI. A control gate CG is formed on the floating gate FG. An insulating film I is formed on the control gate CG. The control gate CG is connected to the word line WL. The drain D is connected to a bit line BL.

Programming (namely, writing) is carried out for the illustrated electrically erasable and programmable nonvolatile memory cell only when the nonvolatile semiconductor memory is supplied with an input datum having a particular logic level which is other than a logic "0" level. The particular logic level of the input datum is a logic "1" level when the input datum is supplied in a form of a two-level of the logic "0" level and the logic "1" level. The input datum may be supplied in another form of a multi-level of, for example, a three-level of the logic "0" level, the logic "1" level, and a logic "2" level. When the input datum is supplied in the form of the three-level, the particular logic level of the input datum is either the logic "1" level or the logic "2" level. When the input datum has the logic "0" level, the programming is not carried out.

The programming is carried out by applying a programming pulse to the illustrated memory cell to make the illustrated memory cell have a programmed threshold voltage as a cell threshold voltage (Vtm). In this event, when the programming pulse is applied to the illustrated memory cell so that the control gate CG and the drain D are kept at a low potential and a high potential, respectively, electrons are drawn or extracted from the floating gate FG to the drain D by a tunnel current. In this event, the cell threshold voltage (Vtm) of the memory cell has a low level (which is hereunder referred to as either a logic "1" level or a logic "2" level). That is, the cell threshold voltage (Vtm) of the memory cell is reduced by applying the programming pulse to the illustrated memory cell in the above-described manner so that the memory cell has a reduced programmed threshold voltage which is not greater than a predetermined upper limit voltage (Vt1).

Erasing is carried out for the illustrated memory cell by keeping the control gate CG and the drain D at a high potential and a low potential, respectively so that electrons are introduced or pulled from the drain D into the floating gate PG. In this event, the cell threshold voltage (Vtm) of the memory cell has a high level (which is hereunder referred to as a logic "0" a level).

In the above-mentioned programming operation, a programming upper limit voltage of the cell threshold voltage (Vtm) is predetermined as the predetermined upper limit voltage (Vt1). When the cell threshold voltage (Vtm) in e very memory cell to be programmed falls within a programmed voltage range defined by the predetermined upper limit voltage (Vt1), the programming operation is finished.

Likewise, in the above-mentioned erasing operation, an erasing lower limit voltage (Vt0) of the cell threshold voltage (Vtm) is predetermined. When the cell threshold voltage (Vtm) in every memory cell to be erased falls within an erased voltage range defined by the erasing lower limit voltage (Vt0), the erasing operation is finished.

Referring to FIGS. 2A, 2B, 3A, and 3B, the programming and the erasing operations in a conventional flash memory will be described in detail.

Figure 2A:
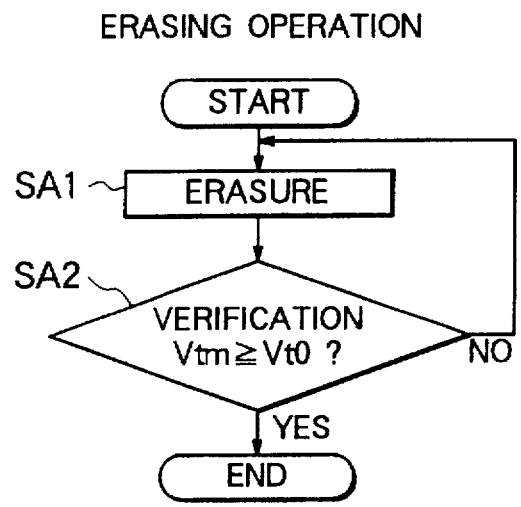
FIGS. 2A and 2B are flow charts for use in describing an erasing operation and a programming operation in a first conventional flash memory, respectively.

As illustrated in FIG. 2A, erasure is carried out in a step SA1. Then, verification is made in a step SA2 to check whether or not the cell threshold voltage (Vtm) is equal to or greater than the erasing lower limit voltage (Vt0). If not (NO in the step SA2), the step SA2 returns to the step SA1 to repeat the erasure until the erasing operation is completed.

Figure 2B:
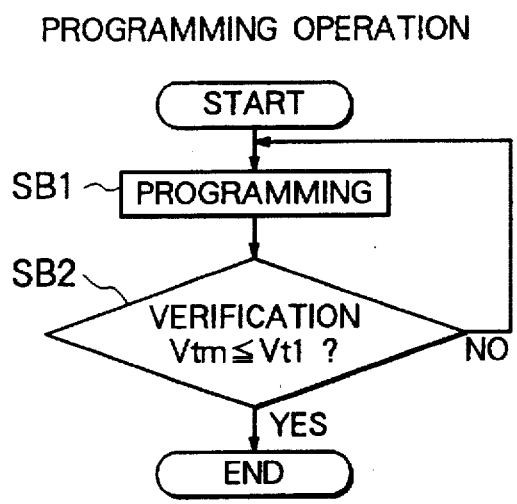

Likewise, as illustrated in FIG. 2B, programming is carried out in a step SB1. Then, verification is made in a step SB2 to check whether or not the cell threshold voltage (Vtm) is equal to or smaller than the predetermined upper limit voltage (Vt1). If not (NO in the step SB2), the step SB2 returns to the step SB1 to repeat the programming until the programming operation is completed.

Figure 3A:
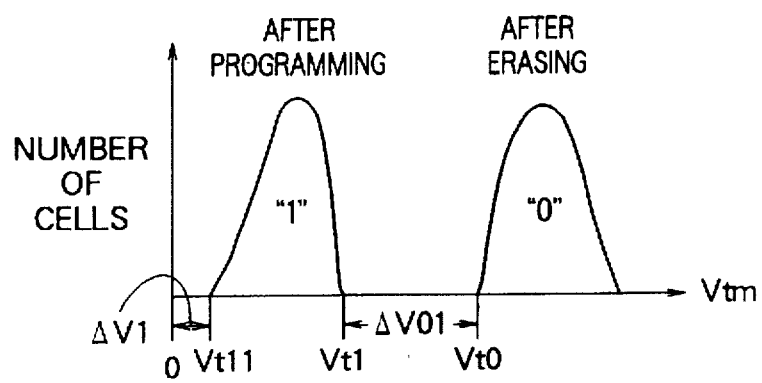
FIGS. 3A and 3B show distributions of cell threshold voltages of the memory cells after completion of the erasing and the programming operations in FIGS. 2A and 2B, respectively.

When the programming or the erasing operation is completed through the above-mentioned steps, the cell threshold voltage (Vtm) has a distribution shown in FIG. 3A. As shown by a logic "1" region in FIG. 3A, the cell threshold voltage (Vtm) is not greater than the predetermined upper limit voltage (Vt1) after completion of the programming operation. As also shown by a logic "0" region in FIG. 3A, the cell threshold voltage (Vtm) is not smaller than the erasing lower limit voltage (Vt0) after completion of the erasing operation.

Such cell condition can be read by checking a conductive state of the memory cell, i.e., occurrence of a cell current by supplying to the control gate CG (FIG. 1) of the memory cell a voltage selected between the erasing lower limit voltage (Vt0) and the predetermined upper limit voltage (Vt1). As illustrated in FIG. 3A, the predetermined upper limit voltage (Vt1) is less than the erasing lower limit voltage (Vt0) by a margin (ΔV01).

Figure 3B:
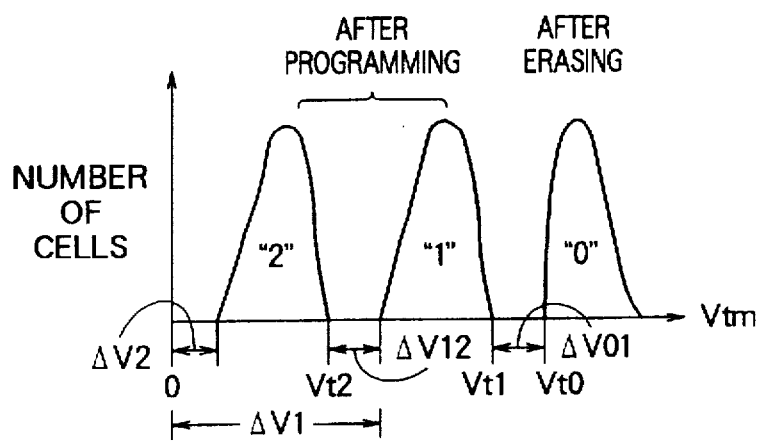

As illustrated in FIG. 3B, the cell threshold voltage (Vtm) may have a plurality of discrete programed conditions corresponding to the logic "1" level and the logic "2" level when the programming is carried out for the input data having the logic "1" and the logic "2" levels in the above-mentioned multi-level. One approach for carrying out programming and read operations of such multi-level data is disclosed in Japanese Unexamined Patent Publication No. 282992/1994.

In case of the multilevel data, another predetermined upper limit voltage (Vt2) is determined in addition to the erasing lower limit voltage (Vt0) and the predetermined upper limit voltage (Vt1) described above. The predetermined upper limit voltage (Vt2) is less than the predetermined upper limit voltage (Vt1). The programming operation is carried out for the input datum of the logic "2" level in the manner similar to those described in conjunction with FIG. 2B. After completion of the programming operation, the cell threshold voltage (Vtm) has a distribution as illustrated in FIG. 3B.

In FIGS. 3A and 3B, after completion of the erasing operation, the cell threshold voltage (Vtm) is not smaller than the erasing lower limit voltage (Vt0) (of the logic "0" region). After completion of the programming operation, the cell threshold voltage (Vtm) has a first condition and a second condition. In the first condition, the cell threshold voltage (Vtm) is not greater than the predetermined upper limit voltage (Vt1) (of the logic "1" region). In the second condition, the cell threshold voltage (Vtm) is not greater than the predetermined upper limit voltage (Vt2) (of a logic "2" region).

The distribution of the cell threshold voltage (Vtm) illustrated in each of FIGS. 3A and 3B has programmed widths of the logic "1" and the logic "2" regions depending upon the fluctuation in memory cell characteristic. In order to increase an operation margin of the memory, the programmed widths of the logic "1" and the logic "2" regions must be narrowed to widen interlogic margins "ΔV01" and "ΔV12" and depletion margins "ΔV1" and "ΔV2". For example, the abovementioned technique is disclosed in Japanese Unexamined Patent Publication No. 182474/1993.

In a method disclosed in the above-referred Japanese Unexamined Patent Publication No. 182474/1993, second verification of the cell threshold voltage (Vtm) is carried out after completion of the programming operation to check whether or not the above-mentioned margins "ΔV12", "ΔV1", and "ΔV2" (FIGS. 3A and 3B) are kept. However, no disclosure is made about narrowing the programmed width s of the logic "1" and the logic "2" regions. That is, no disclosure is made about a programming technique which makes the cell threshold voltages of the programmed memory cells have a narrow distribution.

Japanese Unexamined Patent Publication No. 312093/1995 teaches to repeatedly carry out the erasing operation so that a distribution of the cell threshold voltages of erased memory cells is set within a lower threshold voltage region. No disclosure is made about programming. No disclosure is also made about a programming technique which makes the cell threshold voltages of the programmed memory cells have a narrow distribution.

Now, several embodiments of this invention will be described with reference to the drawings.

Figure 4:
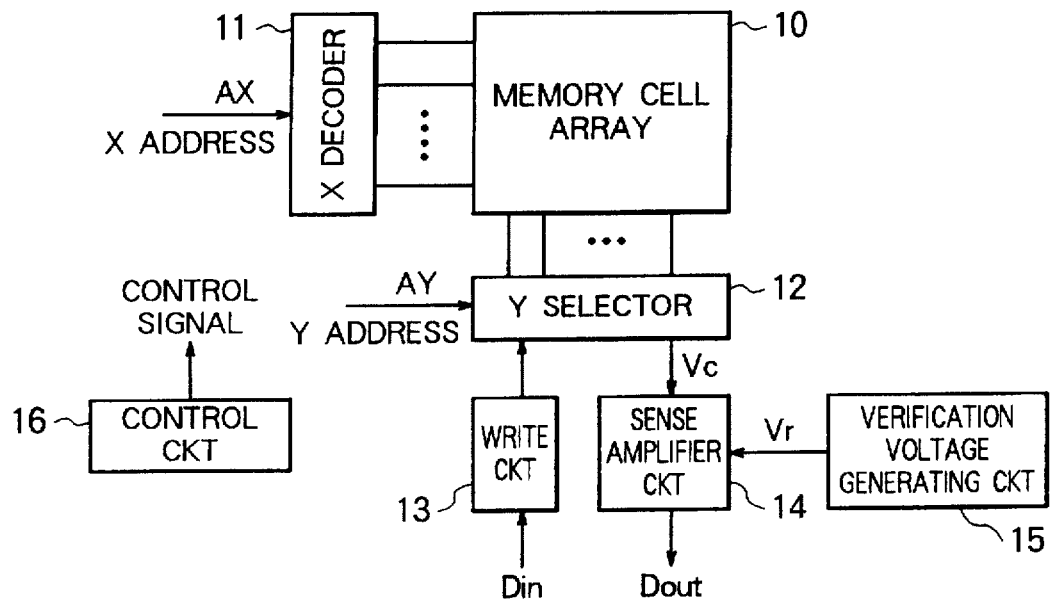
FIG. 4 is a block diagram of a flash memory which is operable as the nonvolatile semiconductor memory to which this invention is applicable.

Referring to FIG. 4, illustration is made of a flash memory which is operable as a nonvolatile semiconductor memory to which this invention is applicable. The illustrated flash memory includes a memory cell array 10 in which a plurality of the electrically erasable and programmable nonvolatile memory cells (each of which is illustrated in FIG. 1) are arranged in a matrix fashion. The illustrated flash memory further includes an X (row) decoder 11, a Y (column) selector 12, a write circuit (WC) 13, a sense amplifier circuit (SA) 14, a verification voltage generating circuit (VRG) 15, and a control circuit 16. The X (row) decoder 11 is connected to the control gates CG (FIG. 1) of the electrically erasable and programmable nonvolatile memory cells through the word lines WL (FIG. 1). The Y (column) selector 12 is connected to the drain D (FIG. 1) of the electrically erasable and programmable nonvolatile memory cells through the bit lines BL (FIG. 1).

A cell threshold voltage (Vtm) has a high (logic "0") level and a low (logic "1") level in an erased condition and a programmed condition, respectively, like the case illustrated in FIG. 3.

As illustrated in FIG. 4, the control circuit 16 produces various control signals for different operation modes. In an erasing mode, the cell threshold voltage (Vtm) is set to become equal to or greater than an erasing lower limit voltage (Vt0) as described in conjunction with FIG. 2A.

Thereafter, input datum (Din) is written by the write circuit (WC) into a selected memory cell selected by an X (row) address (AX) and a Y (column) address (AY). At this time, a programming operation is carried out only when the input datum (Din) has a logic "1" level. On the other hand, when the input datum (Din) has a logic "0" level, no programming operation is carried out as mentioned above. Hereinafter, the programming operation corresponds the case where the input datum has a level other than the logic "0" level.

Figure 5:
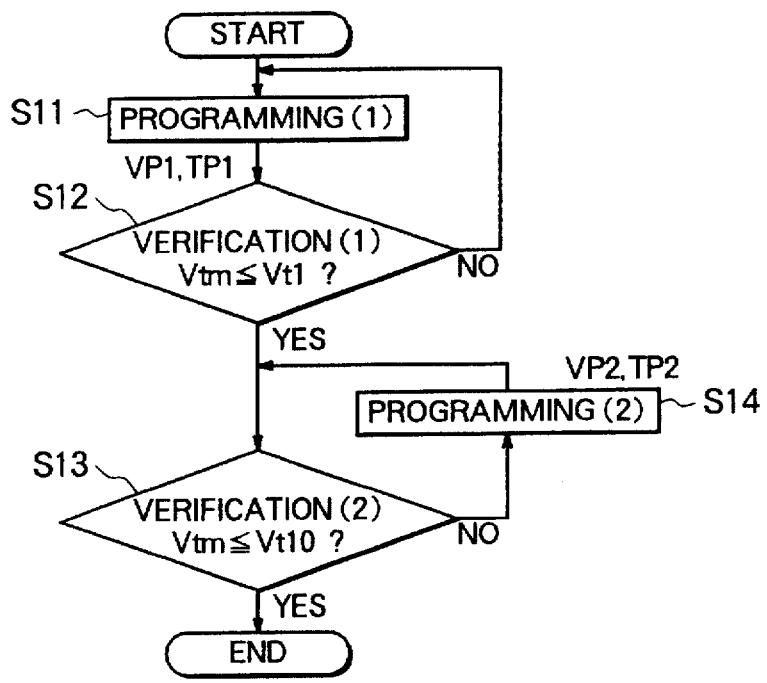
FIG. 5 is a flow chart for use in describing a programming method according to a first embodiment of this invention, which method is carried out in the flash memory illustrated in FIG. 4.

Referring to FIG. 5, description will be made as regards a programming method according to a first embodiment of this invention. The programming method is carried out in the flash memory of FIG. 4 when the datum has a logic "0" level.

Programming (1) is at first carried out in a step S11 by applying to the selected memory cell a first programming pulse having a programming voltage VP1 and a pulse width TP1. As a result, the selected memory cell has a programmed threshold voltage as the cell threshold voltage (Vtm).

Then, in a step S12 following the step S11, first verification (1) is carried out to check whether the cell threshold voltage (Vtm) is equal to or smaller than a first upper limit voltage (Vt1). For this purpose, the sense amplifier circuit (SA) 14 compares a read voltage (Vc) from the selected memory cell and a verification voltage (Vr) generated by the verification voltage generating circuit (VRG). If the cell threshold voltage (Vtm) is greater than the first predetermined upper limit voltage (Vt1), the step S12 returns to the step S11 to repeat the programming (1). If the cell threshold voltage (Vtm) is equal to or smaller than the first predetermined upper limit voltage (Vt1), the step S12 proceeds to a step S13 to carry out second verification (2).

In the second verification (2), it is checked whether or not the cell threshold voltage (Vtm) is equal to or smaller than a second predetermined upper limit voltage (Vt10) lower than the first predetermined upper limit voltage (Vt1). For this purpose, the sense amplifier circuit (SA) 14 carries out similar comparison but with the verification voltage (Vr) changed to a different level. If the cell threshold voltage (Vtm) is greater than the second predetermined upper limit voltage (Vt10), the step S13 turns to a step S14 to carry out second programming (2). The second programming (2) is carried out by applying to the selected memory cell a second programming pulse having a programming voltage VP2 (≦VP1) and a pulse width TP2 (≦TP1) so as to make the selected memory cell have the programmed threshold voltage as the cell threshold voltage (Vtm) which is equal to or smaller than the second predetermined upper limit voltage (Vt10). If the cell threshold voltage (Vtm) is equal to or smaller than the second predetermined upper limit voltage (Vt10), the programming operation to the memory cell is completed.

Figure 6A:
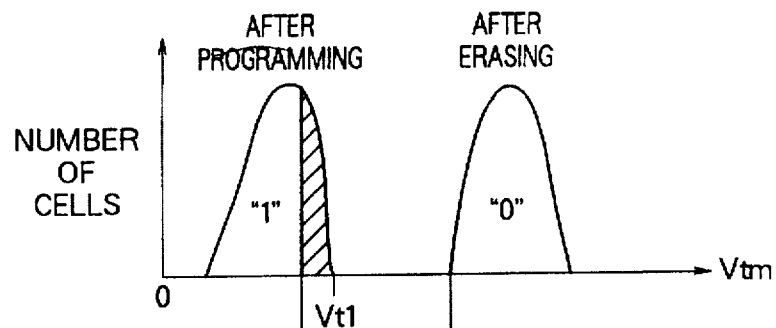
FIGS. 6A and 6B show distributions of cell threshold voltages of memory cells after the programming method is carried out in accordance with the manner illustrated in FIG. 5.
Figure 6B:
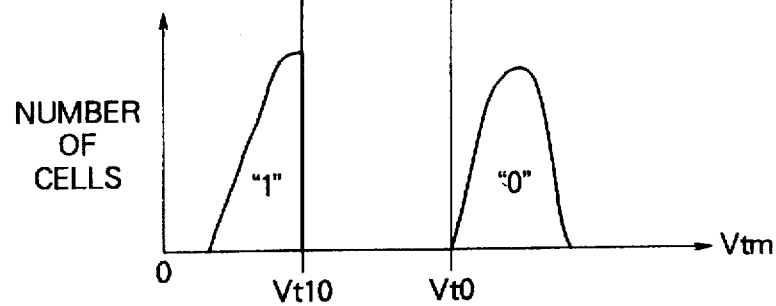

Thus, by executing the programming operation and the program verification a plurality of number of stages with the verification voltage (Vr) changed, the distribution of the cell threshold voltage (Vtm) is narrowed as illustrated in FIG. 6B. Specifically, the cell threshold voltage (Vtm) is lowered to and below the second predetermined upper limit voltage (Vt10) for selected memory cells distributed in a hatched portion in FIG. 6A. For the other memory cells having the cell threshold voltage (Vtm) not higher than the second predetermined upper limit voltage (Vt10) in FIG. 6A, the second programming (2) is not carried out so that the cell threshold voltage (Vtm) is unchanged.

Thus, as shown in FIG. 6B, programmed width of a logic "1" region after completion of the programming operation is narrower than that in the above-described prior art by a difference (Vt1–Vt10).

Figure 7:
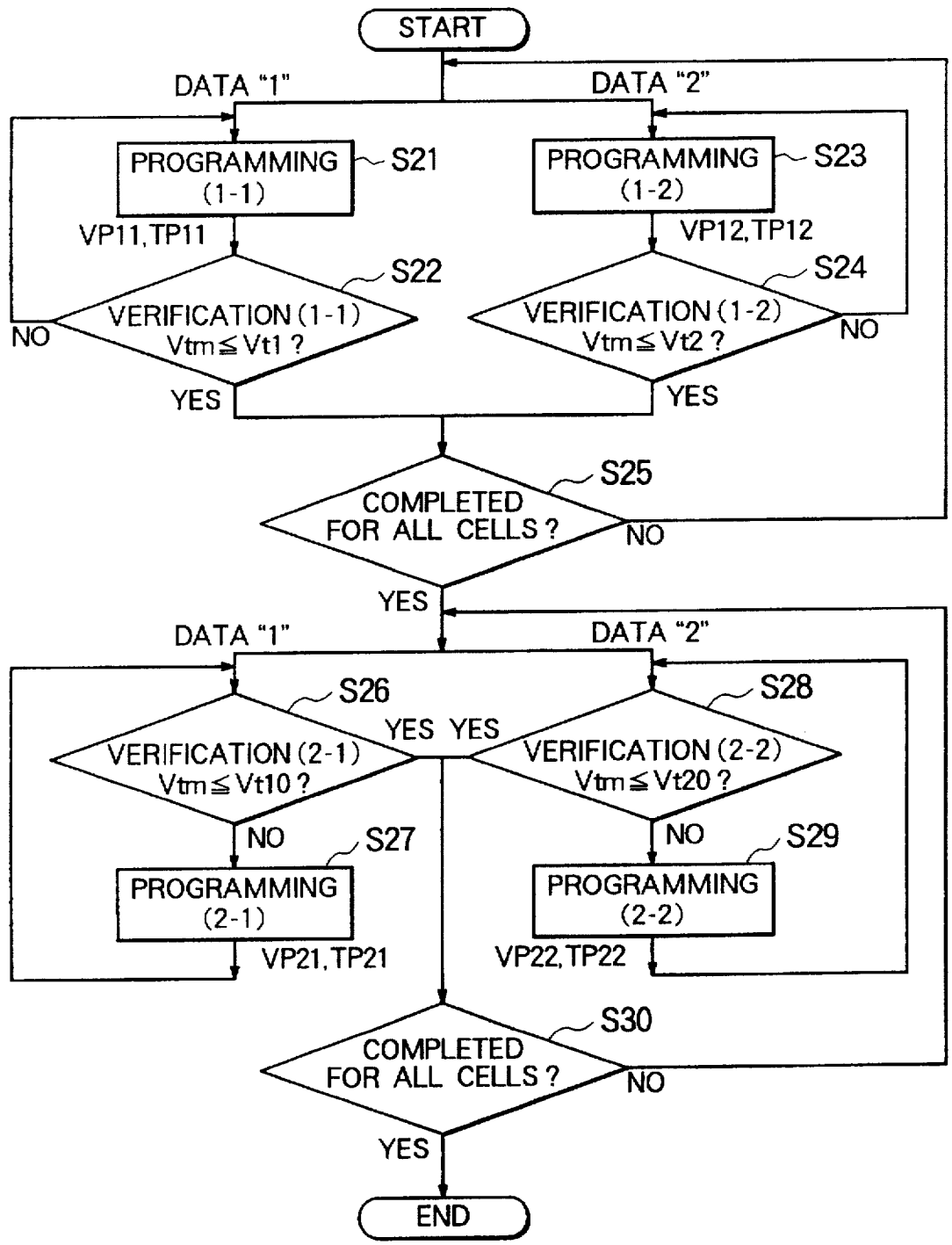
FIG. 7 is a flow chart for use in describing a programming method according to a second embodiment of this invention, which method is carried out in the flash memory illustrated in FIG. 4.

Turning to FIG. 7, a programming method according to a second embodiment of this invention is different from the first embodiment in that three-level data having the logic "0" level, the logic "1" level, and the logic "2" level) are dealt with.

As illustrated in FIG. 7, for the input datum of a logic "1" level, first programming (1-1) is carried out in a step S21 by applying to a selected memory cell a first programming pulse having a programming voltage VP11 and a pulse width TP11. The step S21 is followed by a step S22 to check as first verification (1-1) whether or not the cell threshold voltage (Vtm) is equal to or smaller than a first predetermined upper limit voltage (Vt1) in the manner similar to the first embodiment.

Likewise, for the input datum of a logic "2" level, second programming (1-2) is carried out in a step S23 by applying to another selected memory cell another first programming pulse having a programming voltage VP12 ($\geq$VP11) and a pulse width TP12 ($\geq$TP11). The step S23 is followed by a step S24 to check as first verification (1-2) whether or not the cell threshold voltage (Vtm) is equal to or smaller than another first predetermined upper limit voltage (Vt2).

The above-mentioned steps are repeated until it is judged in a step S25 that the data of the logic "1" level and the logic "2" level are written in the selected memory cells to be subjected to the programming operation. At that time, the cell threshold voltage (Vtm) has a distribution depicted by broken lines in FIG. 8. Thereafter, second verification (2-1) or (2-2) is carried out in a step S26 or S28 and followed by second programming (2-1) or (2-2) in a step S27 or S29 in the manner similar to the first embodiment. As a result, a programmed width of a logic "1" region after completion of the programming operation is narrower by a difference (Vt1–Vt10) as shown by a solid line in FIG. 8. In addition, another programmed width of a logic "2" region after completion of the programming operation is narrower by another difference (Vt2–Vt20) as also shown by a solid line in FIG. 8.

In the second programming (2-1) at the step S27 of FIG. 7, a second programming pulse has a programming voltage VP21 ($\leq$VP11) and a pulse width TP21 ($\leq$TP11) for the datum of a logic "1" level. For the datum of a logic "2" level, a second programming pulse has a programming voltage VP22 ($\leq$VP12) and a pulse width TP22 ($\leq$TP12) in the second programming (2-2) at the step S29 of FIG. 7.

Figure 9:
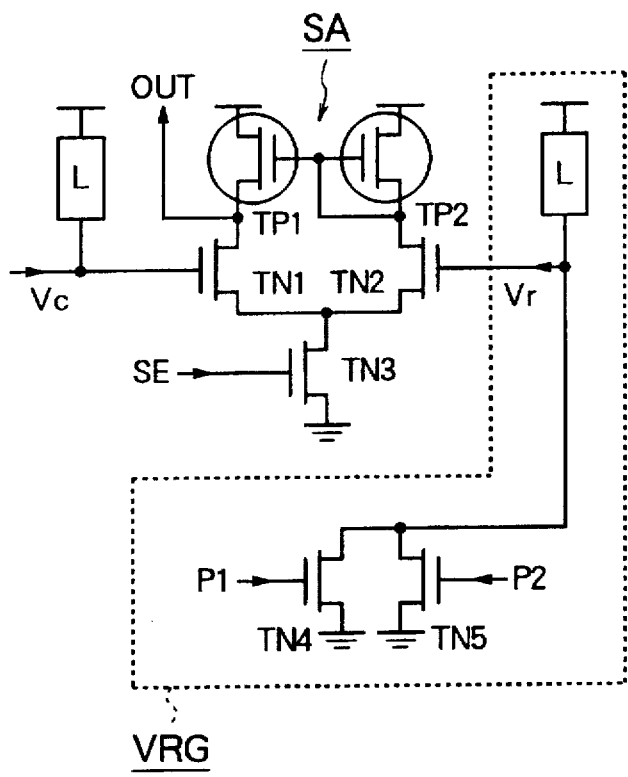
FIG. 9 is a circuit diagram of a sense amplifier circuit illustrated in FIG. 4.
Figure 10:
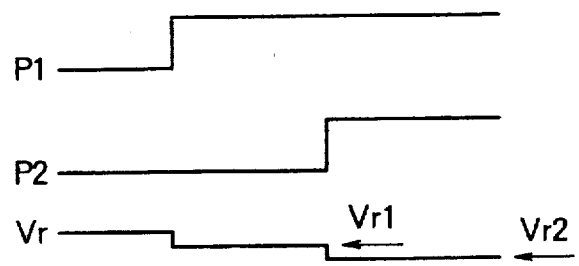
FIG. 10 shows an operation waveform of a verification voltage generating circuit illustrated in FIG. 4.

Referring to FIGS. 9 and 10, the sense amplifier circuit (SA) 14 and the verification voltage generating circuit (VRG) 15 illustrated in FIG. 4 will be described in detail.

As illustrated in FIG. 9, the sense amplifier circuit (SA) 14 comprises a current-mirror type load circuit composed of pMOSFETs TP1 and TP2. The read voltage (Vc) and the verification voltage (Vr) are supplied to gates of nMOSFETs TN1 and TN2, respectively, for comparison therebetween at the timing of a sense enable signal (SE). The result of comparison is extracted as an output signal (OUT).

The read voltage (Vc) is a signal voltage determined by an on current (namely, a read current) of a selected memory cell and a load circuit (L). On the other hand, the verification voltage (Vr) is determined by conductive states of nMOSFETs TN4 and TN5. The output signal (OUT) has a high level and a low level when the read voltage (Vc) is smaller and greater than the verification voltage (Vr), respectively.

Figure 8:
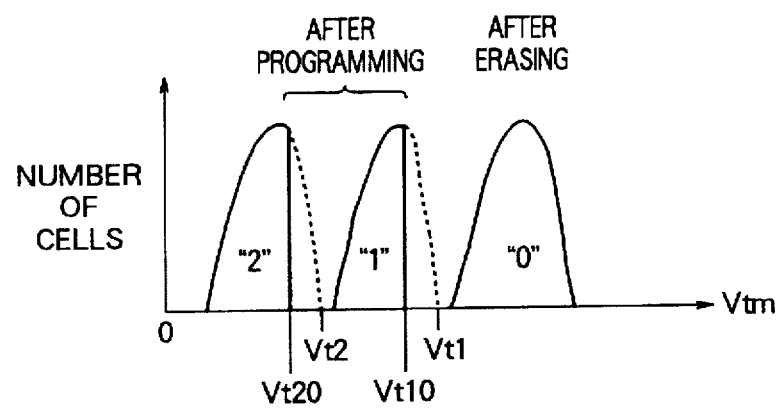
FIG. 8 shows distributions of cell threshold voltages of memory cells after the programming method is carried out in accordance with the manner illustrated in FIG. 7.

Referring to FIG. 10, the verification voltage (Vr) is controlled by switching signals (P1 and P2) and takes a value selected from Vr1 and Vr2. By this selection, the upper limit levels of the cell threshold voltage (Vtm) is switched, i.e., "between Vt1 and Vt10" in the verification (1-1) and (2-1) and "between Vt2 and Vt20" in the verification (1-2) and (2-2) (FIGS. 7 and 8)

Figure 11:
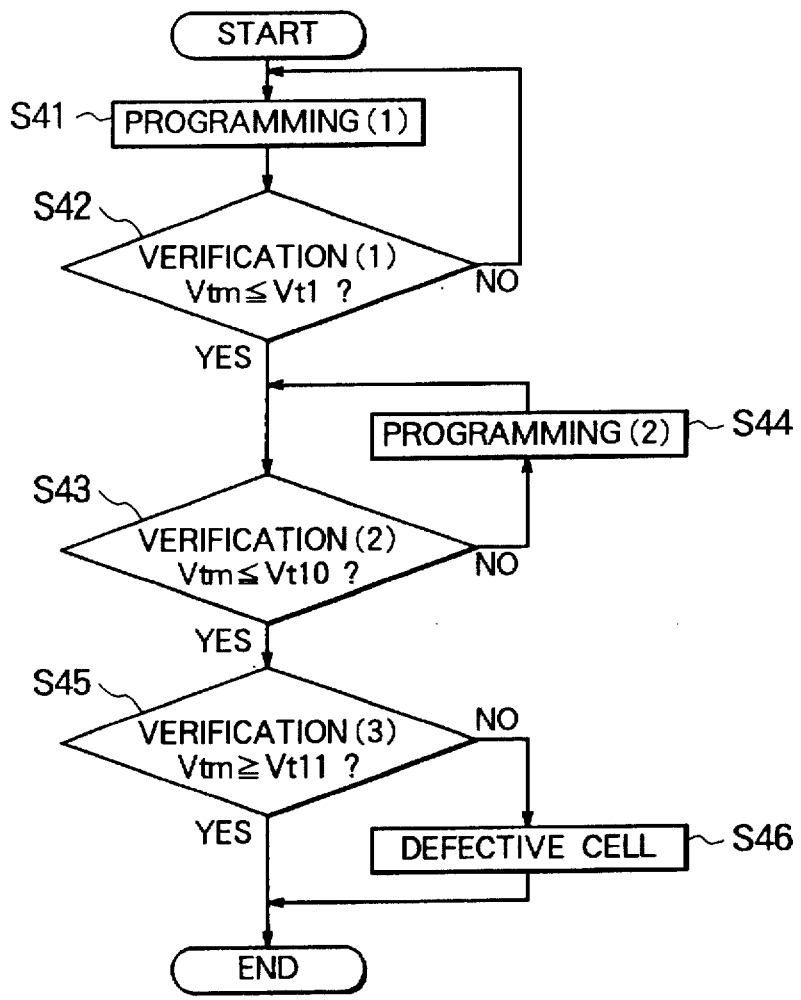
FIG. 11 is a flow chart for use in describing a programming method according to a third embodiment of this invention, which method is carried out in the flash memory illustrated in FIG. 4.

Turning to FIG. 11, a programming method according to a third embodiment is different from the first embodiment in that third verification is carried out which will presently be described.

As illustrated in FIG. 11, programming (1) is carried out in a step S41. The step S41 is followed by a step S42 to carry out the first verification (1) described in conjunction with the first embodiment. If the cell threshold voltage (Vtm) is equal to or smaller than the first predetermined upper limit voltage (Vt1), the step S42 proceeds to a step S43 to carry out the second verification (2). If the cell threshold voltage (Vtm) is greater than the second predetermined upper limit voltage (Vt10) at the step S43, programming (2) is carried out in a step S44. If the cell threshold voltage (Vtm) is equal to or smaller than the second predetermined upper limit voltage (Vt10), the step S43 proceeds to a step S45 to carry out the third verification (3).

In the third verification (3), the selected memory cell has the programmed threshold voltage which is not less than a predetermined lower limit voltage (Vt11). That is, it is checked whether or not the cell threshold voltage (Vtm) is equal to or greater than the predetermined lower limit voltage (Vt11). If the cell threshold voltage (Vtm) is equal to or greater than the predetermined lower limit voltage (Vt11), the programming operation is finished assuming that the selected memory cell in consideration is identified as a normally programmed cell. Otherwise, the step S45 turns to a step S46 where the selected memory cell in consideration is identified as a defective cell (namely, an abnormally programmed cell) and the programming operation is finished.

Figure 12A:
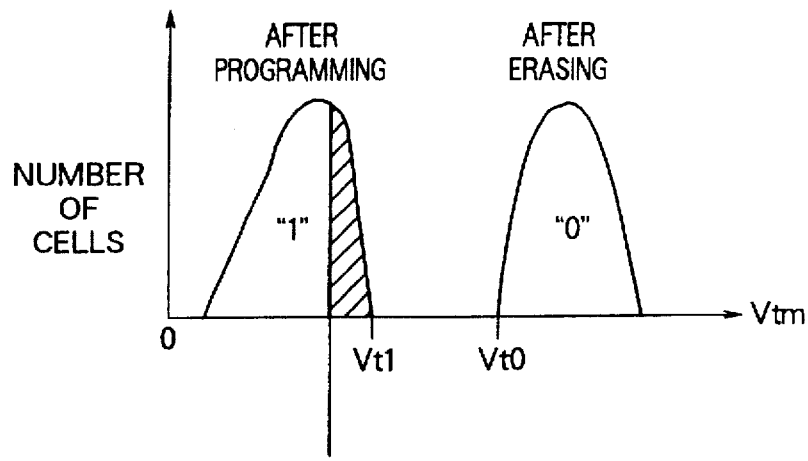
FIG. 12A through 12C show distributions of cell threshold voltages of memory cells after the programming method is carried out in accordance with the manner illustrated in FIG. 11.
Figure 12B:
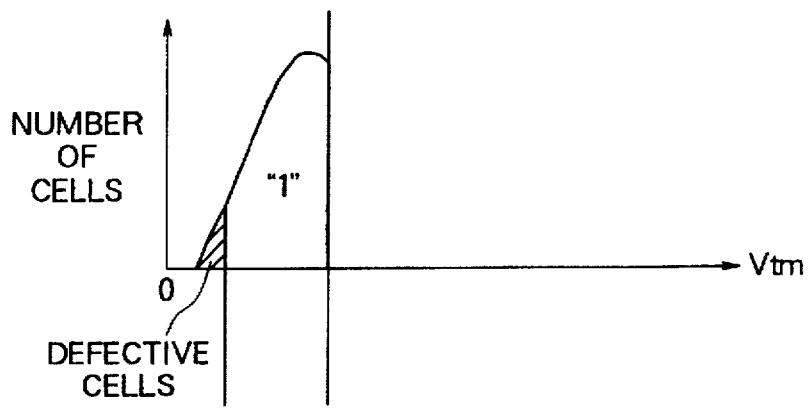
Figure 12C:
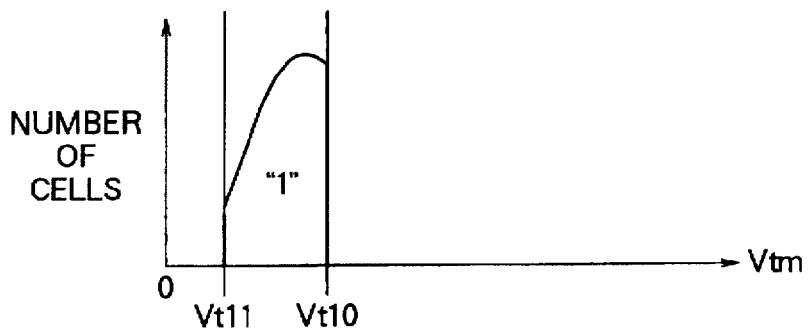

Referring to FIGS. 12(A) through 12(C), the cell threshold voltage (Vtm) has distributions after the first through the third verifications, respectively. As seen from FIG. 12(C), the distribution of the cell threshold voltage (Vtm) for the normally programmed cells is assured to fall within a range between Vt10 and Vt11 after the programming operation is completed. In other words, the distribution of the cell threshold voltage of the normally programmed cells of a logic "1" region has a width as narrow as between Vt10 and Vt11.

Figure 13:
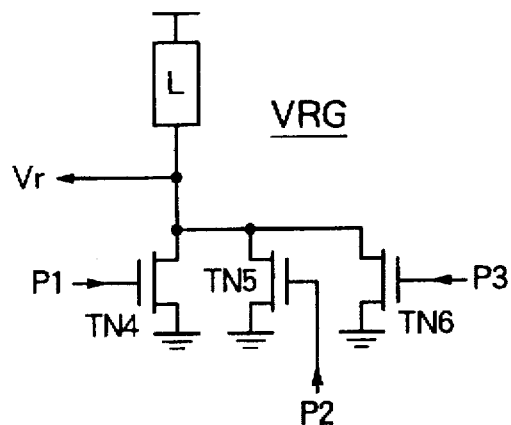
FIG. 13 is a circuit diagram of another verification voltage generating circuit illustrated in FIG. 4.
Figure 14:
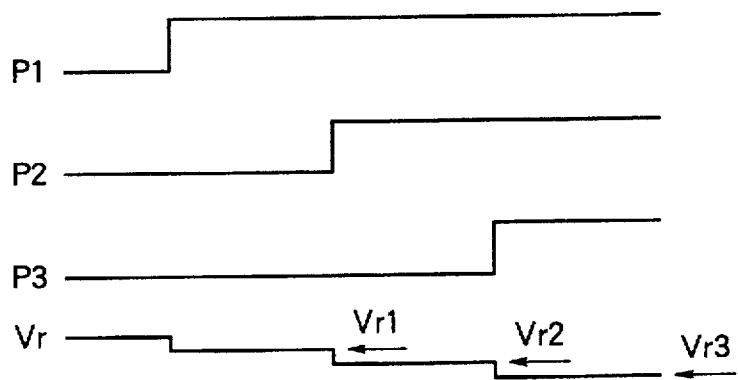
FIG. 14 is a view for use in describing operation of the verification voltage generating circuit illustrated in FIG. 13.

Referring to FIG. 13, illustration is made of another verification voltage generating circuit (VRG) for carrying out the verifications (1), (2), and (3) (FIG. 11). The verification voltage generating circuit (VRG) further has an nMOSFET TN6 in addition to the nMOSFETs TN4 and TN5 of the verification voltage generating circuit (VRG) illustrated in FIG. 9. Referring to FIG. 14, the nMOSFETs TN4, TN5, and TN6 are responsive to the switching signals P1, P2, and P3, respectively, to be controlled in its conductive state. Thus, the verification voltage (Vr) can be selected to Vr1, Vr2, or Vr3. Using these verification voltages Vr1, Vr2, and Vr3 as reference voltages of the sense amplifier circuit (SA) 14 in correspondence to the limit voltages Vt1, Vt10, and Vt11 of the cell threshold voltage (Vtm), the verifications (1), (2), and (3) (FIG. 11) are carried out.

In the foregoing embodiments, description is directed to the memory cell in which the cell threshold voltage is reduced by the programming operation. Alternatively, this invention is also applicable to a memory cell in which the cell threshold voltage is increased by the programming operation. In this case, the programming operation and the verification can be carried out in the manner similar to the foregoing embodiments to obtain an effect similar to that acquired in the foregoing embodiments.

Furthermore, this invention is also applicable to a prior technique related to collective programming of different data into a number of memory cells and disclosed by the present inventors in ISSCC Digest (1994), pp. 148–149 and ISSCC Digest (1996), pp. 36–37).

As described above, according to this invention, there is provided a programming method which can make the threshold voltages of programmed memory cells have a narrow distribution in a nonvolatile semiconductor memory. Therefore, the operation margin of nonvolatile semiconductor memory is widened and the programming and the read operations of the multi-level data can be readily performed.

What is claimed is:

1. A method of programming a selected memory cell of electrically erasable and programmable nonvolatile memory cells of a nonvolatile semiconductor memory in response to an input datum of a particular logic level, said method comprising:

a first programming step of programming said selected memory cell in response to said input datum by applying a first programming pulse to said selected memory cell to make said selected memory cell have a programmed threshold voltage;

a first verifying step of verifying whether said selected memory cell has the programmed threshold voltage which is not greater than a first predetermined upper limit voltage;

a re-executing step of re-executing said first programming step when said first verifying step verifies that said selected memory cell has the programmed threshold voltage which is greater than said first predetermined upper limit voltage, said re-executing step being carried out until said first verifying step verifies that said selected memory cell has the programmed threshold voltage which is not greater than said first predetermined upper limit voltage;

a second verifying step of verifying, when said first verifying step verifies that said selected memory cell has the programmed threshold voltage which is not greater than said first predetermined upper limit voltage, whether said selected memory cell has the programmed threshold voltage which is not greater than a second predetermined upper limit voltage less than said first predetermined upper limit voltage;

a second programming step of programming, when said second verifying step verifies that said selected memory cell has the programmed threshold voltage which is greater than said second predetermined upper limit voltage, said selected memory cell by applying a second programming pulse different from said first programming pulse to said selected memory cell so as to make said selected memory cell have the programmed threshold voltage which is not greater than said second predetermined upper limit voltage; and a completion step of completing programming of said selected memory cell when said second verifying step verifies that said selected memory cell has the programmed threshold voltage which is not greater than said second predetermined upper limit voltage.

2. A method as claimed in claim 1, wherein the particular logic level of said input datum is other than a logic "0" level.

3. A method of programming a selected memory cell of electrically erasable and programmable nonvolatile memory cells of a nonvolatile semiconductor memory in response to an input datum of a particular logic level, said method comprising:

a first programming step of programming said selected memory cell in response to said input datum by applying a first programming pulse to said selected memory cell to make said selected memory cell have a programmed threshold voltage;

a first verifying step of verifying whether said selected memory cell has the programmed threshold voltage which is not greater than a first predetermined upper limit voltage;

a re-executing step of re-executing said first programming step when said first verifying step verifies that said selected memory cell has the programmed threshold voltage which is greater than said first predetermined upper limit voltage, said re-executing step being carried out until said first verifying step verifies that said selected memory cell has the programmed threshold voltage which is not greater than said first predetermined upper limit voltage;

a second verifying step of verifying, when said first verifying step verifies that said selected memory cell has the programmed threshold voltage which is not greater than said first predetermined upper limit voltage, whether said selected memory cell has the programmed threshold voltage which is not greater than a second predetermined upper limit voltage less than said first predetermined upper limit voltage;

a second programming step of programming, when said second verifying step verifies that said selected memory cell has the programmed threshold voltage which is greater than said second predetermined upper limit voltage, said selected memory cell by applying a second programming pulse different from said first programming pulse to said selected memory cell so as to make said selected memory cell have the programmed threshold voltage which is not greater than said second predetermined upper limit voltage;

a third verifying step of verifying, when said second verifying step verifies that said selected memory cell has the programmed threshold voltage which is not greater than said second predetermined upper limit voltage, whether said selected memory cell has the programmed threshold voltage which is not less than a predetermined lower limit voltage less than said second predetermined upper limit voltage; and a completion step of completing programming of said selected memory cell with said selected memory cell identified as a normally programmed cell when said third verifying step verifies that said selected memory cell has the programmed threshold voltage which is not less than said predetermined lower limit voltage, said completion step completing said programming of said selected memory cell with said selected memory cell identified as an abnormally programmed cell when said third verifying step verifies that said selected memory cell has the programmed threshold voltage which is less than said predetermined lower limit voltage.

4. A method as claimed in claim 3, wherein the particular logic level of said input datum is other than a logic "0" level.

5. A method of programming a selected memory cell of electrically erasable and programmable nonvolatile memory cells of a nonvolatile semiconductor memory in response to an input datum of a particular logic level, said method comprising:

a first programming step of programming said selected memory cell in response to said input datum by applying a first programming pulse to said selected memory cell to make said selected memory cell have a programmed threshold voltage;

a first verifying step of verifying whether said selected memory cell has the programmed threshold voltage which is not less than a first predetermined lower limit voltage;

a re-executing step of re-executing said first programming step when said first verifying step verifies that said selected memory cell has the programmed threshold voltage which is less than said first predetermined lower limit voltage, said re-executing step being carried out until said first verifying step verifies that said selected memory cell has the programmed threshold voltage which is not less than said first predetermined lower limit voltage;

a second verifying step of verifying, when said first verifying step verifies that said selected memory cell has the programmed threshold voltage which is not less than said first predetermined lower limit voltage, whether said selected memory cell has the programmed threshold voltage which is not less than a second predetermined lower limit voltage greater than said first predetermined lower limit voltage;

a second programming step of programming, when said second verifying step verifies that said selected memory cell has the programmed threshold voltage which is less than said second predetermined lower limit voltage, said selected memory cell by applying a second programming pulse different from said first programming pulse to said selected memory cell so as to make said selected memory cell have the programmed threshold voltage which is not less than said second predetermined lower limit voltage; and a completion step of completing programming of said selected memory cell when said second verifying step verifies that said selected memory cell has the programmed threshold voltage which is not less than said second predetermined lower limit voltage.

6. A method as claimed in claim 5, wherein the particular logic level of said input datum is other than a logic "0" level.

7. A method of programming a selected memory cell of electrically erasable and programmable nonvolatile memory cells of a nonvolatile semiconductor memory in response to an input datum of a particular logic level, said method comprising:

a first programming step of programming said selected memory cell in response to said input datum by applying a first programming pulse to said selected memory cell to make said selected memory cell have a programmed threshold voltage;

a first verifying step of verifying whether said selected memory cell has the programmed threshold voltage which is not less than a first predetermined lower limit voltage;

a re-executing step of re-executing said first programming step when said first verifying step verifies that said selected memory cell has the programmed threshold voltage which is less than said first predetermined lower limit voltage, said re-executing step being carried out until said first verifying step verifies that said selected memory cell has the programmed threshold voltage which is not less than said first predetermined lower limit voltage;

a second verifying step of verifying, when said first verifying step verifies that said selected memory cell has the programmed threshold voltage which is not less than said first predetermined lower limit voltage, whether said selected memory cell has the programmed threshold voltage which is not less than a second predetermined lower limit voltage greater than said first predetermined lower limit voltage;

a second programming step of programming, when said second verifying step verifies that said selected memory cell has the programmed threshold voltage which is less than said second predetermined lower limit voltage, said selected memory cell by applying a second programming pulse different from said first programming pulse to said selected memory cell so as to make said selected memory cell have the programmed threshold voltage which is not less than said second predetermined lower limit voltage;

a third verifying step of verifying, when said second verifying step verifies that said selected memory cell has the programmed threshold voltage which is not less than said second predetermined lower limit voltage, whether said selected memory cell has the programmed threshold voltage which is not greater than a predetermined upper limit voltage greater than said second predetermined lower limit voltage; and a completion step of completing programming of said selected memory cell with said selected memory cell identified as a normally programmed cell when said third verifying step verifies that said selected memory cell has the programmed threshold voltage which is not greater than said predetermined upper limit voltage, said completion step completing said programming of said selected memory cell with said selected memory cell identified as an abnormally programmed cell when said third verifying step verifies that said selected memory cell has the programmed threshold voltage which is greater than said predetermined upper limit voltage.

8. A method as claimed in claim 7, wherein the particular logic level of said input datum is other than a logic "0" level.

* * * * *